US006239535B1

(12) United States Patent
Toda et al.

(10) Patent No.: US 6,239,535 B1
(45) Date of Patent: May 29, 2001

(54) OMNI-DIRECTIONAL ULTRASONIC TRANSDUCER APPARATUS HAVING CONTROLLED FREQUENCY RESPONSE

(75) Inventors: Minoru Toda, Lawrenceville, NJ (US); Kyung-Tae Park, Berwyn, PA (US); Susan Huang Zaks, Norristown, PA (US); Jeffrey D. Swan, West Chester, PA (US)

(73) Assignee: Measurement Specialties Inc., Fairfield, NJ (US)

( * ) Notice: Subject to any disclaimer, the term of this patent is extended or adjusted under 35 U.S.C. 154(b) by 0 days.

(21) Appl. No.: 09/281,398

(22) Filed: Mar. 30, 1999

Related U.S. Application Data

(60) Provisional application No. 60/080,101, filed on Mar. 31, 1998.

(51) Int. Cl.[7] ...................................................... H01L 41/08

(52) U.S. Cl. .......................... 310/334; 310/324; 310/369; 310/800

(58) Field of Search ..................................... 310/334, 336, 310/337, 324, 800

(56) References Cited

U.S. PATENT DOCUMENTS

| | | | | |
|---|---|---|---|---|
| 3,792,204 | * | 2/1974 | Murayama et al. | 310/800 X |
| 3,832,580 | * | 8/1974 | Yamamuro et al. | 310/334 X |
| 3,862,477 | * | 1/1975 | Ayers et al. | 310/800 X |
| 4,064,375 | * | 12/1977 | Russell et al. | 310/800 X |
| 4,486,869 | * | 12/1984 | Carter | 310/800 X |
| 4,558,249 | * | 12/1985 | Lerch et al. | 310/324 X |
| 4,825,116 | * | 4/1989 | Itoh et al. | 310/369 X |
| 5,357,486 | * | 10/1994 | Pearce | 310/800 X |
| 5,361,240 | * | 11/1994 | Pearce | 310/800 X |

* cited by examiner

*Primary Examiner*—Mark O. Budd
(74) *Attorney, Agent, or Firm*—Arthur L. Plevy; Duane, Morris & Heckscher

(57) ABSTRACT

A transducer apparatus is disclosed including a spool member having a body portion and first and second elevated regions formed on the body portion. A piezoelectric film such as a PVDF film surrounds the spool member and is spaced apart from the body portion of the spool member by an elevation of the elevated region, thereby forming a predetermined gap between the piezoelectric film and the body portion of the spool member. The predetermined gap is at least 0.1 mm and enables a predetermined resonance frequency in the piezoelectric film to control the resonance frequency of the transducer. Opposite lateral ends of the piezoelectric film are secured together such that secured ends of the piezoelectric film have substantially the same resonance frequency as a remainder of the piezoelectric film.

28 Claims, 2 Drawing Sheets

OMNI-DIRECTIONAL ULTRASONIC TRANSDUCER APPARATUS HAVING CONTROLLED FREQUENCY RESPONSE

RELATED APPLICATIONS

This application is related to co-pending provisional patent application serial number 60/080,101 filed on Mar. 31, 1998 entitled OMNI-DIRECTIONAL ULTRASONIC TRANSDUCER APPARATUS and to co-pending commonly assigned patent application Ser. No. 09/281,247, filed on Mar. 30, 1999, entitled OMNI-DIRECTIONAL ULTRASONIC TRANSDUCER APPARATUS AND STAKING METHOD.

FIELD OF THE INVENTION

The present invention relates to the field of transducers. More particularly, the present invention relates to an omnidirectional ultrasonic transducer apparatus.

DESCRIPTION OF RELATED ART

In the environment of transducers, it is known that an ultrasonic transducer may be formed with either a linear or curved film incorporated therein. Each of the types of film is described in the following.

Referring first to FIG. 4, a linear polymer piezoelectric film 50 is shown. When an AC voltage is applied to electrodes 52 on surfaces of the film 50, the film length in the molecular chain direction shrinks or expands. In other words, the PVDF (polymer piezoelectric material) is stretched during the process, and molecular chains are aligned in parallel. This is due to excitation in the linear direction.

Alternatively, a cylindrical piezoelectric film 54 is shown in FIG. 5 whereby the stretched axis is wrapped around a cylinder (not shown). Here, when an AC voltage is applied to electrodes 56 on surfaces of the cylindrical film 54, the length vibration is converted to radial vibration. This is the principle of PVDF tweeter as disclosed in "Electroacoustic Transducers with Piezoelectric High Polymer Films", J. Audio Eng. Soc. Vol. 23, No.1, pp. 21–26, (1975) by M. Tamura et al. The high polymer element in the piezoelectric film is a poly-vinylidene fluoride) (PVDF) in film form.

The cylindrical PVDF vibrator has a certain mass and stiffness for radial expansion or shrinkage, and this mass and stiffness enable a resonance whose frequency is $f_0$=(½ pR)ÖY/r where R is the radius in meters, Y is Young's modulus (N/$m^2$), and r is density (Kg/$m^3$). (1)

This equation is shown in a paper by A. S. Fiorillo entitled "Design and Characterization of a PVDF Ultrasonic Range Sensor", IEEE Trans. Ultrasonics, Ferroelectrics and Frequency Control", Vol. 39, No. 6, pp. 688–692 (1992), which is for semi-circularly curved film with both ends clamped, but it has the same resonance frequency as a cylinder.

In IEEE paper, the cylindrical PVDF film is mounted on a smooth-surfaced spool. The radius of the spool determines the resonance frequency through equation (1). The PVDF film can be directly wrapped around a cylindrical surface of the spool with almost no gap between the surface of the film and the surface of the spool. Even though the appearance is of no gap, the film is actually supported on the spool by many tiny points of surface roughness. It has been determined that most of the supported area has gaps of from 2–20 microns between the contacts of the many tiny points of surface roughness. Since actual vibration amplitudes are about 1 micron peak to peak for a 150 Vpp drive, there are enough spaces to vibrate and actually permit the device to work.

However, in the known application of a film to a spool as described, two problems have been discovered by the inventors of the instant application. First, it has been discovered that with the "gap-free" wrapping attempted in the known art, there is a problem of uncontrollable resonance frequency. Secondly, in the "gap-free" wrapping, there is a reduced vibration of the PVDF film.

In other words, since the air found in the 2~20 micron region (the "back air space") has a stiffness and spring effect, this also increases the effective stiffness of the PVDF film and in turn increases the resonance frequency of the film. Also, many points of contact are present between the cylinder and the PVDF film such that energy is lost due to friction, and the vibration of the PVDF film is thereby reduced. Since a thickness of the back air space is not controlled in the known art, nor recognized that it could or should be controlled, the resonance frequency and reduction in vibration also can not be controlled. Instead, it has been discovered by the inventors that if back air thickness exceeds a certain value, the spring effect of back air becomes less and even becomes negligible, thereby solving both problems of uncontrollable resonance frequency and reduction in vibration.

Accordingly, a need in the art exists for an ultrasonic transducer apparatus in which a thickness of a space between a PVDF film and a spool supporting the film is controlled. Controlling of the thickness of the space between the PVDF film and the spool has been discovered by the inventors to reduce a spring effect of air trapped therebetween and ultimately controls resonance frequency and improves vibration in a manner not heretofore known in the art.

OBJECTS AND SUMMARY OF AN EMBODIMENT OF THE INVENTION

It is an object of an embodiment of the invention to provide an ultrasonic transducer apparatus having a controlled resonance frequency.

It is another object of an embodiment of the invention to provide an ultrasonic transducer apparatus having an air thickness of a predetermined value between a spool and a film surrounding the spool.

It is yet another object of an embodiment of the invention to provide an ultrasonic transducer apparatus in which the air thickness of a predetermined value between the spool and the film surrounding the spool is selected to substantially negate a spring effect of the air therebetween.

It is a still further object of an embodiment of the invention to provide a cost effective ultrasonic transducer apparatus for eliminating the problems found in the known art of ultrasonic transducer.

These and other objects of the present invention are achieved by providing a transducer apparatus including a spool member having a body portion and first and second elevated regions formed on the body portion. A piezoelectric polymer film such as a PVDF film surrounds the spool member and is spaced apart from the body portion of the spool member by an elevation of the elevated region, thereby forming a predetermined gap between the electrode film and the body portion of the spool member. The predetermined gap is at least 0.1 mm to enable a predetermined resonance frequency in the piezoelectric film. Opposite lateral ends of the piezoelectric film are secured together such that secured ends of the piezoelectric film have substantially the same resonance frequency as a remainder of the electrode film.

Advantages of an embodiment of the invention as described more fully hereinbelow include a cost effective assembly for providing an ultrasonic transducer assembly having improved resonance. This is accomplished by reducing a spring effect between a film surrounding a spool in an ultrasonic transducer assembly by forming a predetermined back air space between the film and the spool.

Additionally, the ultrasonic transducer of the instant disclosure reduces the complexity and cost previously associated with the use of ultrasonic transducers. The stored coils are easily accessible and manageable in a manner not previously known in the art.

BRIEF DESCRIPTION OF THE DRAWINGS

The present invention will become more fully understood from the detailed description given by way of illustration only, and thus are not limitative of the present invention, and wherein.

DETAILED DESCRIPTION OF THE INVENTION

While the present invention may have many applications, an exemplary application and related description follows. Specifically, a purpose of the present invention is to provide an ultrasonic transducer apparatus having improved resonance. To that end, the following is a detailed description of an embodiment according to the teachings of the present invention.

Figure 1:
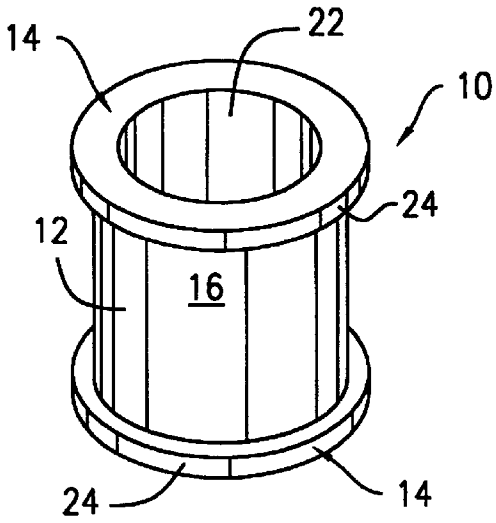
FIG. 1 is a perspective view of a spool for an ultrasonic transducer.

Referring first to FIG. 1, there is illustrated a spool 10 for use with an ultrasonic transmitter (FIG. 3) in connection with the present invention. The spool 10 is of a unique shape and includes a cylindrical body portion 12 and a pair of elevated regions 14 surrounding the cylindrical body portion 12. The cylindrical body portion 12 has an outer peripheral surface 16, an inner surface 18, and opposite ends 20. The inner surface 18 defines a longitudinal opening 22 of a uniform cylindrical shape corresponding to the shape of the cylindrical body portion 12.

The elevated regions 14 of the spool 10 are integrally formed with the body portion 12 of the spool 10 and may either be of a one-piece construction with the body portion 12 or attached to the body portion by suitable securing methods. As shown, there are two elevated regions 14. Each elevated region 14 is coextensive with one of the opposite ends 20 of the cylindrical body portion 12 so as to extend therefrom and terminates in an outer edge 24 of the elevated region 14. The positioning of the elevated region 14 at opposite ends 20 of the cylindrical body portion 12 has been found to be optimal for the ultrasonic transmitter of the present invention. However, this arrangement should not be construed to eliminate the possibility of the elevated region 14 being set in from one or more opposite ends 20 of the cylindrical body portion 12 of the spool 10. Further, the outer peripheral edge 24 of the elevated region 14 is shown to be at least 0.1 mm from the outer peripheral surface 16 of the body portion 12. The determination of that optimum distance and its effect will be described in the following.

Figure 2:
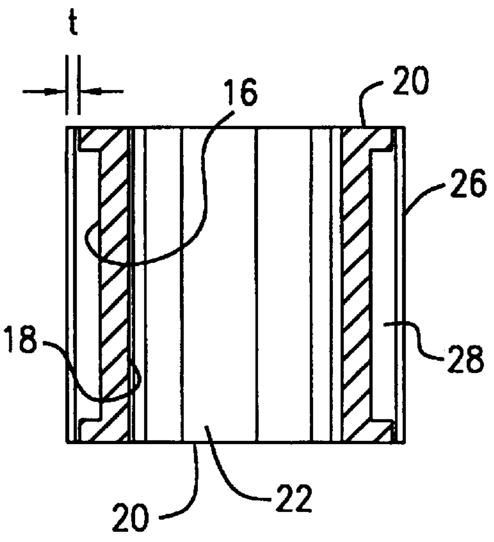
FIG. 2 is a side view of the spool shown in FIG. 1 with a film wrapped around the spool.

Referring now in further detail to FIG. 2, there is shown a film 26 wrapped around the spool 10. In particular, the film 26 is a PVDF film similar to the type used in the conventional art but applied to a cylinder in a different manner than known in the art. As shown here, the film 26 is of a sheet type having opposite longitudinal edges and opposite lateral edges. The longitudinal edges are positioned to surround the outer peripheral edge 24 of the elevated region 14 rather than being in direct surface contact with the body portion 12 of the spool. The distance between the outer peripheral surface 16 of the cylindrical body portion 12 and the outer edge 24 of the elevated region is at least 0.1 mm. The positioning of the film around the outer edge 24 creates a back air area 28 between a back surface of the film 26 and the outer peripheral surface 16 of the cylindrical body portion 12.

The reason for the distance between the outer peripheral surface 16 of the body portion 12 and the outer peripheral edge 24 of the elevated region 14 is to provide an effective spring constant between the body portion 12 of the spool and the wrapped film 26. The effective spring constant of the back air area 28 is given by $K_a$=2 pRHr$V_S^2$/d where d is the back air gap in meters, R is the radius of the film, H is the height of the cylinder in meters, here shown at approximately 12 mm, r is the air density measured by 1.3 Kg/$m^3$, and $V_s$ is the sound velocity at 344 m/s(2)

The effective spring of the PVDF cylinder is $K_p$=2 pHYt/R where Y is the effective Young's modulus of PVDF with approximately [5~6×$10^9$N/$m^2$] Ag/C electrodes (6×$10^9$N/$m^2$), and t is the total thickness with electrodes at approximately 30~50 mm. (3)

In order for $K_a$ to become ⅕ of $K^p$, d has to be greater than 0.9×$10^{-4}$ lt (where 1 is the wavelength) which is 0.1 mm for the above parameters. Therefore the film 26 has to be held with a certain space between the film 26 and the outer peripheral surface 16 of the cylindrical body 12. Accordingly, the opposite ends 20 of the spool 10 have the elevated regions 14 as shown.

The film 26 has a uniform radial vibration motion from top to bottom (longitudinal edge to longitudinal edge of the film 26) if the film 26 is not bonded to anything. If the longitudinal edge areas of the film 26 are bonded to the elevated regions 14, respectively, the bonded regions 14 will not vibrate but the remaining non-bonded area will vibrate. Although the transducer characteristics such as the resonance frequency and the output pressure are not much different for either case, it is preferred that there is no bonding between the film 26 and the outer longitudinal edges 24 of the elevated regions 14. Not only are production and a processing of the transducer apparatus simplified when an extra step of bonding is eliminated, but the resonance frequency is improved and vibration is reduced.

Figure 3:
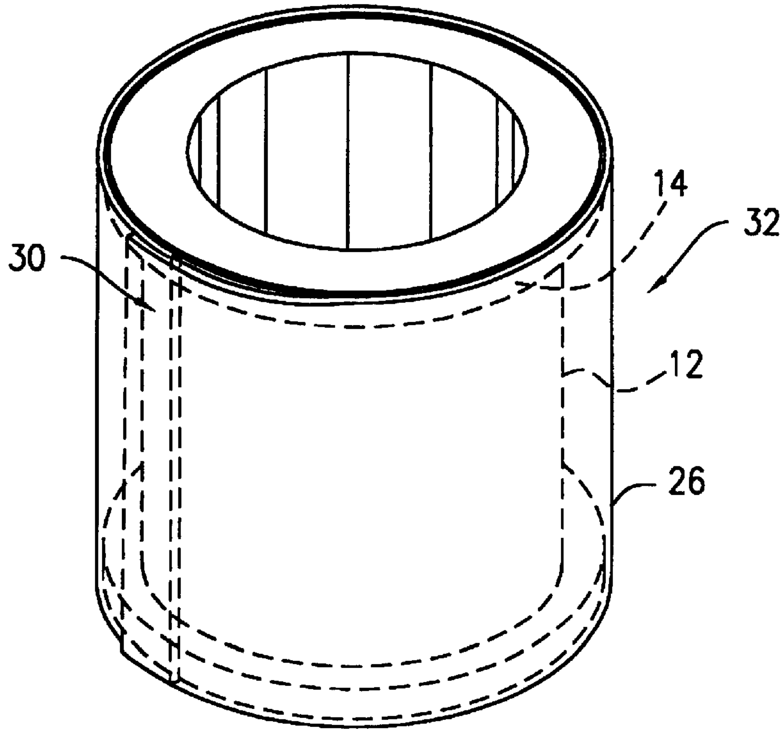
FIG. 3 is a perspective view of the combined spool and film showing a general location of joining of the film to itself.
Figure 4:
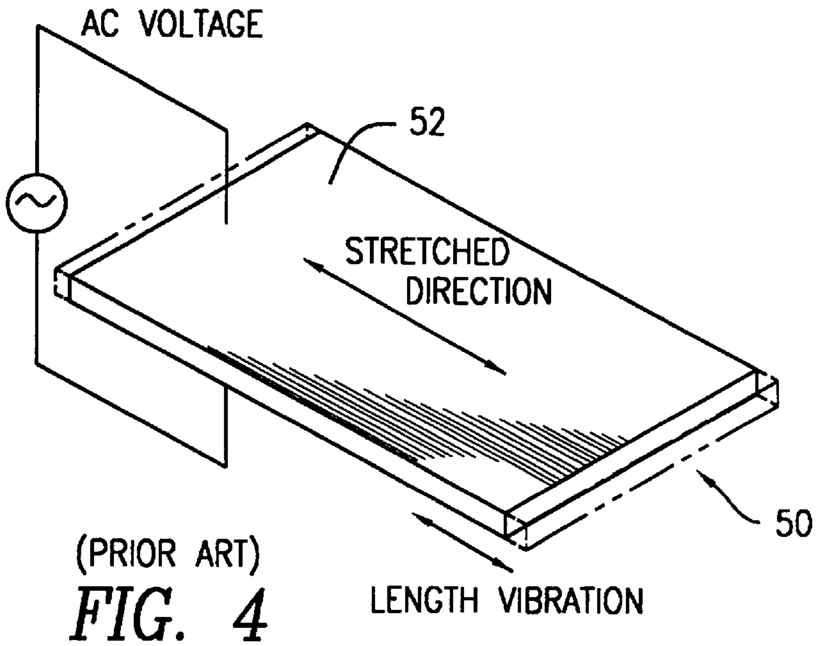
(PRIOR ART) FIG. 4
FIG. 4 is a perspective view of a conventional straight PVDF film prior to forming a cylindrical shape with the film.
Figure 5:
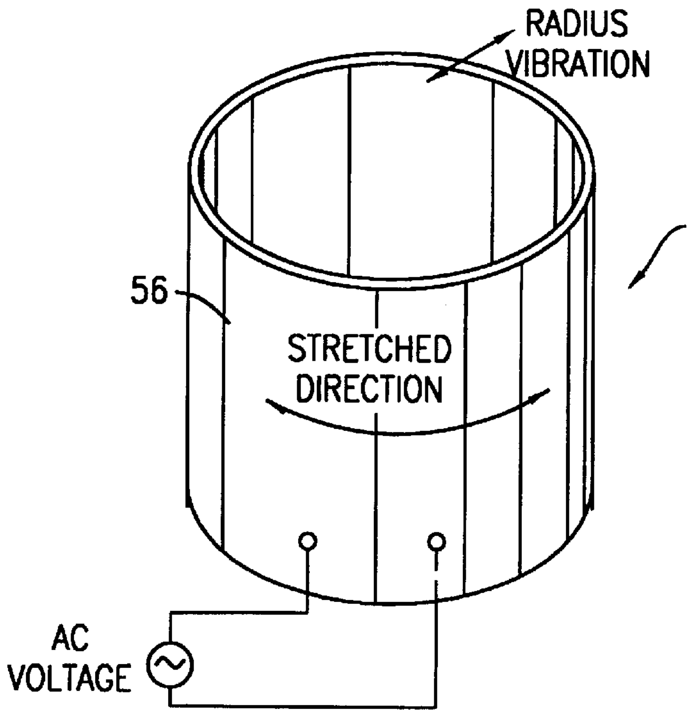
(PRIOR ART) FIG. 5
FIG. 5 is a perspective view of the PVDF film of FIG. 5 after forming the cylindrical shape and applied to a conventional spool.

Turning now to FIG. 3, the film 26 must be secured in some fashion to itself when wrapped around the spool 10. As an example, one end 30 (lateral end) of the film 26 is joined to the opposite end 30 by overlapping the opposite ends and securing the same together. In this instance, securing of the lateral edges together is by an adhesive or the like.

A radius of the spool 10 can be determined by its ultimate application to an end product. For example if the size of the end product to which the PVDF film 26 is mounted has a diameter of 7~15 mm, the resonance frequency can be determined by Equation (1) above. Young's modulus of PVDF and density are modified by Ag-carbon ink formed on the surface of the film 26. Accordingly, the parameters to be used for Equation (1) are Young's modulus of PVDF, $Y_p=4\times10^9$ N/$m^2$ Young's modulus of Ag/C ink, $Y_{AgC}=8\times10^9$ N/$m^2$ Thickness of PVDF $t_p$=18–35 micron Thickness of Ag/C ink, $t_{AgC}$=5–10 micron per one side (actually on both sides)

Density of PVDF $P_p$=1800 Kg/$m^3$

Density of Ag/C ink $P_{AgC}$=2000 Kg/$m^3$

Thickness weighted Young's modulus $Y=(Y_pt_p+2Y_{Agc}t_{Agc})/(t_P+2t_{AgC})=6.1\sim5\times10^9$ where $6.1\times10^9$ is the thickest Ag/C and $5\times10^9$ is the thinnest Ag/C Thickness weighted density $r=(r_Pt_p+2r_{AgC}t_{Agc})/(t_P+2t_{AgC})$=1900~1850 Kg/$m^3$ where 1900 is the thinnest PVDF and 1850 is the thickest PVDF and $R=3.5\sim7.5\times10^3$m.

Using these parameters, the resonance frequency ranges from 35~81 Khz with 35 Khz being the lowest possible frequency and 81 Khz being the highest possible frequency from the above parameters.

It should be noted that carbon ink is commercially available, however the resistivity thereof is too high such that the electrode resistance is not negligible compared to the transducer impedance which becomes lower at a high frequency. Therefore, carbon ink can be used only for a low frequency device. At an ultrasonic frequency region (high frequency), silver ink is better because of its much lower resistance, but silver tarnishes due to sulfurization. Therefore silver needs surface coating which is an extra process. Further, the color of a silver carbon mixture is dark, and tarnished silver is invisible. Thus, a silver-carbon mixture is necessary for high-frequency applications.

The invention having been described, it is clear that certain modifications and variations of the ultrasonic transducer apparatus can be made without departing from the spirit and scope of the invention. These modifications may include the application of various materials for the film, spool, and related components, and is intended to include variations in size and shape of the recited components to the extent that they are still able to perform as described. These obvious modifications and variations are within the theme and spirit of the invention and are considered within the scope of the following claims.

What is claimed is:

1. A transducer apparatus comprising:

a spool member having a body portion and first and second elevated regions formed on the body portion;

a piezoelectric film surrounding said spool member and unsecured thereto, said piezoelectric film spaced apart from the body portion of said spool member by an elevation of the elevated regions, thereby forming a predetermined gap between said piezoelectric film and the body portion of said spool member, wherein the predetermined gap is sufficiently sized for enabling a predetermined resonance frequency in said piezoelectric film to control the resonance frequency of the transducer.

2. The apparatus according to claim 1, further comprising a securing material for securing ends of the piezoelectric film together, said securing material enabling secured ends of said piezoelectric film to have substantially the same resonance frequency as a remainder of said piezoelectric film.

3. The apparatus according to claim 2, wherein said piezoelectric film includes opposite lateral ends, opposite longitudinal edges transverse from the opposite lateral ends, an inner surface facing said spool member, and an outer surface opposite the inner surface and wherein the opposite longitudinal edges of said piezoelectric film are aligned with the first and second elevated regions of said spool, respectively.

4. The apparatus according to claim 1, wherein the predetermined gap d is determined by $d>0.9\times10^{-4}$ $l^2/t$ where l is wavelength and t is thickness.

5. The apparatus according to claim 1, wherein the predetermined gap is at least 0.1 mm.

6. The apparatus according to claim 1, wherein the elevation of the elevated region is determined by $d>0.9\times10^4$ $l^2/t$ where l is wavelength and t is thickness.

7. The apparatus according to claim 1, wherein said predetermined gap is an air gap, and wherein the thickness of said air gap is selected to reduce a spring effect of the air trapped therebetween for controlling said transducer resonance frequency.

8. The apparatus according to claim 1, wherein the elevated regions of said spool member are positioned coextensive with opposite ends of said spool member.

9. The apparatus according to claim 1, wherein the elevated regions are integrally formed with said spool member.

10. The apparatus according to claim 1, wherein the elevated regions are formed as a one-piece construction with said spool member.

11. The apparatus according to claim 3, wherein the longitudinal edges of said film are each in surface contact with an outer periphery of a corresponding one of the elevated regions.

12. An omni-directional ultrasonic transducer for use with an external device, the improvement to the ultrasonic transducer comprising:

a spool member having a body portion and first and second elevated regions formed on the body portion;

a piezoelectric film surrounding said spool member and unsecured thereto, said piezoelectric film spaced apart from the body portion of said spool member by an elevation of the elevated region, thereby forming a substantially uniform predetermined gap between said piezoelectric film and the body portion of said spool member, the predetermined gap sufficiently sized so as to mitigate perturbations to a predetermined resonance frequency in said piezoelectric film.

13. The apparatus according to claim 12, further comprising a securing material for securing ends of the piezoelectric film together, said securing material enabling secured ends of said piezoelectric film to have substantially the same resonance frequency as a remainder of said piezoelectric film.

14. The apparatus according to claim 13, wherein said piezoelectric film includes opposite lateral ends, opposite longitudinal edges transverse from the opposite lateral ends, an inner surface facing said spool member, and an outer surface opposite the inner surface and wherein the opposite longitudinal edges of said piezoelectric film are aligned with the first and second elevated regions of said spool, respectively.

15. The apparatus according to claim 12, wherein the predetermined gap d is determined by $d>0.9\times10^{-4}$ $l^2/t$ where l is wavelength and t is thickness.

16. The apparatus according to claim 12, wherein the predetermined gap is at least 0.1 mm.

17. The apparatus according to claim 12, wherein the elevation of the elevated region is determined by $d>0.9\times 10^{-4}\ l^2/t$ where l is wavelength and t is thickness.

18. The apparatus according to claim 12, wherein the elevation of the elevated region is at least 0.1 mm from a surface of the body portion of said spool member.

19. The apparatus according to claim 12, wherein the elevated regions of said spool member are positioned coextensive with opposite ends of said spool member.

20. The apparatus according to claim 12, wherein the elevated regions are integrally formed with said spool member.

21. The apparatus according to claim 12, wherein the elevated regions are formed as a one-piece construction with said spool member.

22. The apparatus according to claim 13, wherein the longitudinal edges of said film are each in surface contact with an outer periphery of a corresponding one of the elevated regions.

23. A transducer apparatus comprising:

a spool member having a body portion and first and second elevated regions formed on said body portion;

a piezoelectric film surrounding said spool member and unsecured thereto, said piezoelectric film spaced apart from said body portion via said first and second elevated regions to form a gap between said piezoelectric film and the body portion of said spool member, said gap having a thickness selected so as to not influence the resonance frequency of the piezoelectric film.

24. The transducer apparatus according to claim 23, wherein said piezoelectric film surrounding said spool member has opposing lateral ends secured to one another by a securing material, said securing material enabling secured ends to have substantially the same resonance frequency as a remainder of said piezoelectric film.

25. The transducer apparatus according to claim 23, wherein said gap is an air gap.

26. The transducer apparatus according to claim 24, wherein said piezoelectric film further includes opposite longitudinal edges transverse from said opposite lateral ends, said opposite longitudinal edges of said film are each in surface contact with an outer periphery of a corresponding one of the elevated regions.

27. A transducer apparatus comprising:

a cylindrical member having a body portion;

a piezoelectric film surrounding said cylindrical member and unsecured thereto, said piezoelectric film spaced apart from said body portion of said cylindrical member to form a gap between said piezoelectric film and said body portion, said gap having a thickness selected so as to not influence the resonance frequency of the piezoelectric film.

28. A transducer apparatus comprising:

a cylindrical member having a body portion;

a piezoelectric film surrounding said cylindrical member and unsecured thereto, said piezoelectric film spaced apart from the body portion of said cylindrical member to form a predetermined air gap between said piezoelectric film and said body portion, wherein said air gap is sized so as to have an effective spring constant Ka of about one fifth of the effective spring constant Kb of said film.

* * * * *